US010055519B2

(12) United States Patent
Savard et al.

(10) Patent No.: US 10,055,519 B2
(45) Date of Patent: Aug. 21, 2018

(54) PULSE SHAPE CHANGE FOR INTERFACE DETERMINATION

(71) Applicant: Honeywell International Inc., Morris Plains, NJ (US)

(72) Inventors: Stephane Savard, Vancouver (CA); Frank Martin Haran, N. Vancouver (CA)

(73) Assignee: Honeywell International Inc., Morris Plains, NJ (US)

( * ) Notice: Subject to any disclaimer, the term of this patent is extended or adjusted under 35 U.S.C. 154(b) by 533 days.

(21) Appl. No.: 14/880,383

(22) Filed: Oct. 12, 2015

(65) Prior Publication Data

US 2016/0117426 A1    Apr. 28, 2016

Related U.S. Application Data

(60) Provisional application No. 62/067,502, filed on Oct. 23, 2014.

(51) Int. Cl.
*G01F 23/284* (2006.01)
*G06F 17/50* (2006.01)
*G06F 17/16* (2006.01)

(52) U.S. Cl.
CPC ........ *G06F 17/5009* (2013.01); *G01F 23/284* (2013.01); *G06F 17/16* (2013.01)

(58) Field of Classification Search
CPC .................................................. G01F 23/284
USPC ........................................................ 342/124
See application file for complete search history.

(56) References Cited

U.S. PATENT DOCUMENTS

| 3,812,422 A | * | 5/1974 | De Carolis | G01F 23/284 |
| | | | | 324/642 |
| 3,832,900 A | | 9/1974 | Ross | |
| 3,853,005 A | * | 12/1974 | Schendel | G01F 23/284 |
| | | | | 324/643 |
| 4,635,478 A | * | 1/1987 | Hope | G01F 23/0023 |
| | | | | 137/558 |
| 4,786,857 A | * | 11/1988 | Mohr | G01F 23/284 |
| | | | | 324/643 |

(Continued)

FOREIGN PATENT DOCUMENTS

EP    2148218    1/2010
WO    2013044953    4/2013

*Primary Examiner* — Peter M Bythrow
(74) *Attorney, Agent, or Firm* — Jetter & Associates, P.A.

(57) ABSTRACT

A method of pulsed radar interface determination for a first and second material in a tank. An interface level determination model is provided including a transfer function that utilizes refractive indices for the materials and thickness of the second material. At least one actual radar pulse is transmitted into the tank and a resulting echo curve portion including a measured interface pulse(s) around the interface location is measured. The interface model is simulated with a reference pulse and an initial thickness value to generate an initial model generated interface pulse (initial MGIP). The measured interface pulse is compared to the initial MGIP pulse point-by-point to determine residuals. If the residuals sum >a predetermined threshold, the comparing is repeated with an updated interface model generated with an updated thickness value that provides an updated MGIP pulse. When the sum of residuals is ≤predetermined threshold, the thickness is determined.

20 Claims, 5 Drawing Sheets

(56) References Cited

U.S. PATENT DOCUMENTS

| | | | | |
|---|---|---|---|---|
| 4,924,700 | A * | 5/1990 | Habart | G01D 5/247 367/908 |
| 6,445,192 | B1 * | 9/2002 | Lovegren | G01F 23/284 324/644 |
| 6,545,945 | B2 * | 4/2003 | Caulfield | G01N 29/348 342/22 |
| 6,838,622 | B2 * | 1/2005 | Zuch | H02G 3/22 174/100 |
| 7,135,872 | B2 * | 11/2006 | Bentolila | G01N 22/00 324/640 |
| 7,477,059 | B2 * | 1/2009 | Carobbio | G01F 23/284 137/391 |
| 7,542,866 | B1 * | 6/2009 | Lovegren | G01F 23/284 340/618 |
| 7,586,435 | B1 * | 9/2009 | Edvardsson | G01F 23/284 324/600 |
| 7,800,528 | B2 * | 9/2010 | Nilsson | G01F 23/284 342/124 |
| 8,567,243 | B2 * | 10/2013 | Malinovskiy | G01F 23/0061 342/124 |
| 8,963,769 | B2 * | 2/2015 | Linden | G01F 23/284 342/124 |
| 2002/0177961 | A1 | 11/2002 | Lovegren et al. | |
| 2004/0046572 | A1 * | 3/2004 | Champion | G01F 23/284 324/637 |
| 2004/0229376 | A1 * | 11/2004 | Beauducel | G01F 23/2845 436/164 |
| 2007/0046528 | A1 | 3/2007 | Larsson et al. | |
| 2009/0158839 | A1 * | 6/2009 | Spanke | G01F 23/284 73/290 V |
| 2009/0273506 | A1 | 11/2009 | Delin | |
| 2012/0169528 | A1 | 7/2012 | Edvardsson et al. | |
| 2013/0076559 | A1 * | 3/2013 | Edvardsson | G01S 13/36 342/124 |
| 2014/0085133 | A1 * | 3/2014 | Flasza | G01F 23/284 342/124 |
| 2014/0104098 | A1 * | 4/2014 | Linden | G01F 23/284 342/124 |
| 2015/0084809 | A1 * | 3/2015 | Flasza | G01F 23/284 342/124 |
| 2016/0103008 | A1 * | 4/2016 | Edvardsson | G01S 13/88 342/124 |

\* cited by examiner

METHOD 100

101 — PROVIDING REFRACTIVE INDICES FOR A FIRST AND SECOND MATERIAL IN A TANK, AND AN INTERFACE LEVEL DETERMINATION MODEL (INTERFACE MODEL) INCLUDING A TRANSFER FUNCTION THAT UTILIZES THE REFRACTIVE INDICES AND A THICKNESS OF THE SECOND MATERIAL AS PARAMETERS.

102 — TRANSMITTING AT LEAST ONE ACTUAL RADAR PULSE INTO THE TANK AND MEASURING A RESULTING ECHO CURVE OR ECHO CURVE PORTION INCLUDING AT LEAST ONE MEASURED INTERFACE PULSE AROUND A LOCATION OF THE INTERFACE.

103 — SIMULATING THE INTERFACE MODEL USING A PROCESSOR WITH A REFERENCE PULSE AS AN INPUT ALONG WITH AN INITIAL VALUE FOR THE THICKNESS TO GENERATE AN INITIAL MODEL GENERATED INTERFACE PULSE (INITIAL MGIP).

104 — COMPARING THE MEASURED INTERFACE PULSE TO THE INITIAL MGIP POINT-BY-POINT OVER A PLURALITY OF POINTS TO DETERMINE RESIDUALS.

105 — IF THE SUM OF THE RESIDUALS IS > A PREDETERMINED THRESHOLD, ITERATING BY REPEATING THE COMPARING WITH AN UPDATED INTERFACE MODEL WITH AN UPDATED VALUE FOR THE THICKNESS THAT PROVIDES AN UPDATED MGIP.

106 — WHEN THE SUM OF RESIDUALS ≤ THE PREDETERMINED THRESHOLD, THE THICKNESS IS DETERMINED.

*FIG. 1*

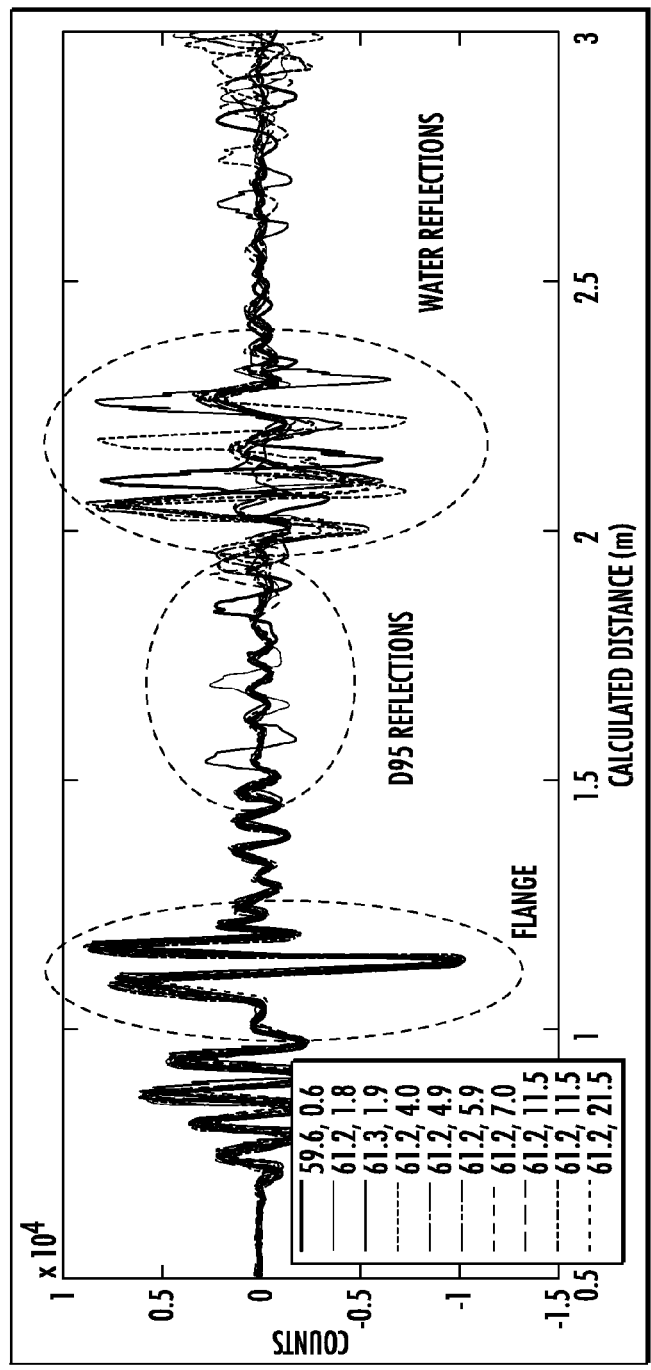
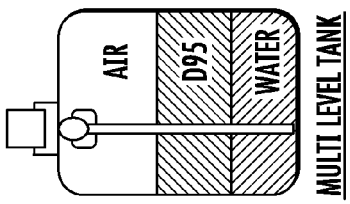
FIG. 4

PULSE SHAPE CHANGE FOR INTERFACE DETERMINATION

CROSS REFERENCE TO RELATED APPLICATIONS

This application claims the benefit of Provisional Application Ser. No. 62/067,502 entitled "PULSE SHAPE CHANGE FOR PULSED RADAR INTERFACE DETERMINATION", filed Oct. 23, 2014, which is herein incorporated by reference in its entirety.

FIELD

Disclosed embodiments relate to level finding for pulsed radar.

BACKGROUND

Industrial plants having containers or tanks ("tanks") generally need to regularly measure the level of liquid(s) or other materials therein such as powders therein. There are several types of systems and techniques used for level measurement, which generally use either frequency modulated continuous wave (FMCW) or time domain reflectometry (TDR) that relies on analyzing echoes for pulsed signals to make material level measurements using time-of-flight.

For TDR-based measurements, there are contact level measurements, where a part of the system, such as a probe, contacts the material being measured, and non-contact level measurements where the level is measured without contacting the material to be measured. Non-contact methods include ultrasound, which uses high-frequency sonic (sound) waves to detect the level, and radar.

Guided wave radar (GWR) is a particular contact pulsed radar method used to measure the level of liquids or solids in a tank. GWR works by generating a stream of pulses of electromagnetic energy and propagating the pulses down a transmission line formed into a level sensing probe (or waveguide). The probe is generally placed vertically in a tank or other container and the electromagnetic pulse is launched downward from the top of the probe. The probe is open to both the air and the material(s) to be sensed in such a way that the electromagnetic fields of the propagating pulse penetrate the air until they reach the level of the material. At that point, the electromagnetic fields see the higher dielectric constant of the material. This higher dielectric constant causes a reduction in the impedance of the propagating medium, resulting in a pulse echo being reflected back toward the top of the probe. The pulse travels through the air dielectric portion of the probe at a known velocity. This allows the material level(s) on the probe to be determined by measuring the round trip travel time of the pulse from the top of the probe to the level and the echo back to the top of the probe.

When using a pulsed radar sensor (whether contact or non-contact) for measuring a first product material level in a tank, if a second material having a lower density such as an oil is also in the tank, a layer of the second material will be formed on top of the first material (e.g., water) surface creating a liquid interface. Customers are generally interested in knowing the thickness or level of the second layer, such as to allow the selective removal of the second layer, for example when there is oil on water, and one may want to selectively remove the oil.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize conventional pulsed radar level finding based on peak finding algorithms can only identify interfaces when the top layer is at least about 10 cm thick, and below about 10 cm only one peak (combined peaks) will be shown. The inability of conventional pulsed radar level sensing systems to measure <10 cm thick upper layers (e.g., oil on water) in tanks has been identified herein to be associated with the pulsed radar level sensing circuit's pulse width (narrower pulse width providing better resolution) and the level determination algorithm using peak finding which requires the respective peaks to be resolvable from one another to identify the presence of an interface and the thickness of the upper layer.

Disclosed algorithms instead use the pulse shape change by comparing a measured interface pulse to model generated interface pulse (MGIP) to better extract the level and second material thickness information, which has been found to reduce the minimum thickness needed to measure an interface using a pulsed radar level sensor, such as to an upper layer thickness of 2 cm or less.

Disclosed embodiments include a method of pulsed radar interface determination for a first and second material in a tank. An interface level determination model is provided including a transfer function that utilizes refractive indices for the materials and thickness of the second material. At least one actual pulse is transmitted into the tank and a resulting echo curve portion including a measured interface pulse(s) around the interface location is measured. The interface model is simulated with a reference pulse and an initial thickness value to generate an initial MGIP. The measured interface pulse is compared to the initial MGIP pulse point-by-point to determine residuals. If the residuals sum is >a predetermined threshold, the comparing is repeated with an updated interface model generated using an updated thickness value that provides an updated MGIP pulse. When the sum of residuals is ≤predetermined threshold, the thickness of the second material and its level is determined.

BRIEF DESCRIPTION OF THE DRAWINGS

FIG. 1 is a flow chart that shows steps in an example method of pulsed radar interface level determination, according to an example embodiment.

FIG. 4 shows measured echo curve field data for oil on water in a tank for different oil thicknesses.

DETAILED DESCRIPTION

Figure 2:
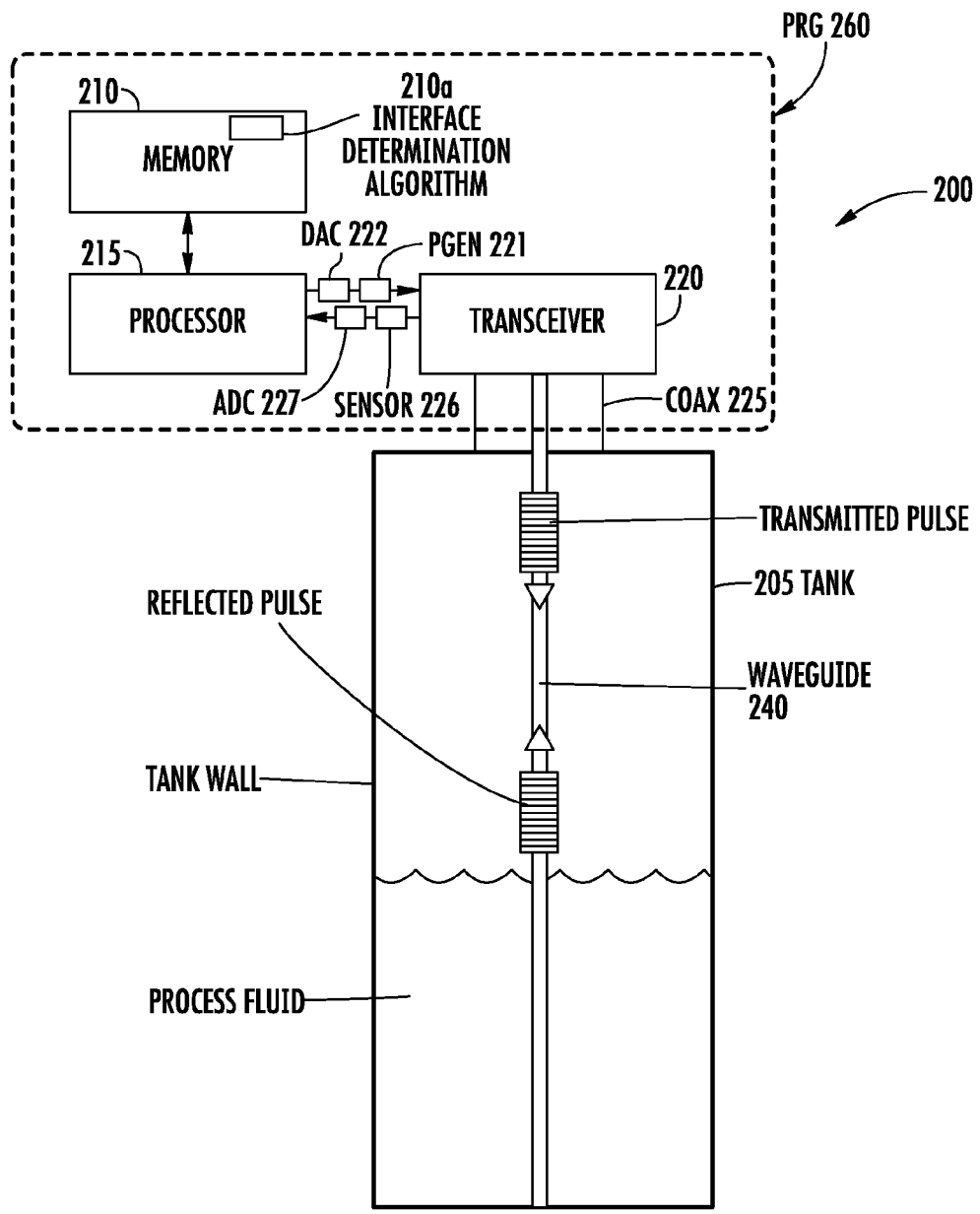
FIG. 2 depicts an example pulsed radar system shown as a guided wave radar (GWR) system having a pulsed radar level gauge including a pulsed radar interface determination algorithm implemented in the firmware of a memory associated with a processor, according to an example embodiment.

Disclosed embodiments are described with reference to the attached figures, wherein like reference numerals are used throughout the figures to designate similar or equivalent elements. The figures are not drawn to scale and they are provided merely to illustrate certain disclosed aspects. Several disclosed aspects are described below with reference to example applications for illustration. It should be understood that numerous specific details, relationships, and methods are set forth to provide a full understanding of the disclosed embodiments.

One having ordinary skill in the relevant art, however, will readily recognize that the subject matter disclosed herein can be practiced without one or more of the specific details or with other methods. In other instances, well-known structures or operations are not shown in detail to avoid obscuring certain aspects. This Disclosure is not limited by the illustrated ordering of acts or events, as some acts may occur in different orders and/or concurrently with other acts or events. Furthermore, not all illustrated acts or events are required to implement a methodology in accordance with the embodiments disclosed herein.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a flow chart that shows steps in an example method 100 of pulsed radar interface level determination, according to an example embodiment. Step 101 comprises providing refractive indices for a first and a second material in a tank, the second material being less dense as compared to the first material and forming an interface with the first material, and an interface level determination model (interface model) including a transfer function that utilizes the refractive indices and a thickness of the second material as parameters. The tank operator generally knows what materials are within the tank.

The interface model can comprise an ABCD matrix, an approximated Fresnel equations or an electrical impedance model. It is noted that to be efficient (in terms of processing time) the interface model (e.g., ABCD matrix model, approximated Fresnel equations, or an electrical impedance model) is applied in the time domain. The first material and second material can both comprise liquids (e.g., oil on water) or powders. The second material is less dense as compared to the first material so that the second material sits above the first material in the tank.

Step 102 comprises transmitting at least one actual radar pulse into the tank and measuring a resulting echo curve or echo curve portion including at least one measured interface pulse around a location of the interface. In practice, due to power limitations for the transmitter, there will be a plurality of radar pulses and the echo curve will be an echo curve portion. The peaks for the first material and the second material may overlap, particularly if the thickness of the second material is <10 cm.

In step 103 the interface model simulated using a processor (e.g., digital signal processor (DSP) or microcontroller unit (MCU) with a reference pulse as an input along with an initial value for the thickness to generate an initial MGIP. The reference pulse can comprise a through pulse (such as using a splitter in the transceiver) or a flange pulse. The reference pulse can also comprise a level pulse obtained from calibration (e.g., when tank is empty). The reference pulse is generally updated over time, such as after a predetermined period of time or after determining a drift in at least one transmitter circuit parameter (e.g., to account for pulse amplitude or pulse width drift).

Step 104 comprises comparing the measured interface pulse to the initial MGIP point-by-point over a plurality of points (e.g., 5 or 6 per pulse) to determine a plurality of residuals. The comparing can be performed automatically by software, or by an individual. A non-linear least squares fitting algorithm may be used for the comparing.

In step 105 if a sum of the residuals is >a predetermined threshold, iteration is performed by repeating the comparing with an updated interface model together with an updated value for the thickness to provide an updated MGIP. In one embodiment, if the sum of residuals is >the predetermined threshold, simulating is repeated with the updated value for thickness to generate the updated interface model and updated MGIP therefrom. In another embodiment, if the sum of residuals is >the predetermined threshold, an updated MGIP can be obtained from a stored library of updated MGIPs that reflect pulses for different thicknesses.

The updated thickness value can be automatically generated by a perturb-and-measure algorithm, where the thickness value used by the model can be adjusted by a small amount and the resulting residuals then measured. If the residuals decrease, further adjustments for the thickness in that direction are tried, and if the residuals increase, further adjustments to the thickness value are made in the other direction.

In step 106 when the sum of residuals is <the predetermined threshold, the thickness is determined. The level of the second material layer may also be determined.

The ABCD matrix shown below includes a transfer function having parameters $m_{11}$, $m_{12}$, $m_{21}$, $m_{22}$ that relate an output (echo curve) waveform having x and y components say $E^o x$, $E^o_y$ (E being the electric field) to a reference pulse as the input. The M's are parameters based on the refractive index and thickness of respective materials or mediums and their interfaces in the tank that the electric field is propagating through to an input (transmitted) pulse waveform having components $E^i x$, $E^i y$:

$$\begin{bmatrix} E^o & x \\ E^o & y \end{bmatrix} = \begin{bmatrix} m_{11} & m_{12} \\ m_{21} & m_{22} \end{bmatrix} \times \begin{bmatrix} E^i & x \\ E^i & y \end{bmatrix}, \text{ where}$$

$$M = M_i M_{i+1} M_{i+2} \ldots = \begin{bmatrix} m_{11} & m_{12} \\ m_{21} & m_{22} \end{bmatrix}$$

The ABCD matrix may also be referred to as a transmission matrix, or transmission parameters of a two port network. For example, a 2 interface system in a tank may comprise air over oil over water so that in that case $M_i = M_{air}$ having refractive index $n_{air}$, $M_{i+1} = M_{oil}$ having $n_{oil}$ and $M_{i+2} = M_{water}$ having $n_{water}$. An example ABCD matrix approach applied to predict an output for an optical system given an optical input and an optical network is also described in a textbook Optics, Eugene Hecht, second edition, Addison-Wesley Publishing Company. Inc. 1987, p. 373-378.

The residuals (differences in amplitude) can then be looked at between the measured interface pulse and the MGIP. As described above, if the sum of residuals is too high based on a predetermined threshold (magnitude), the interface model can be reapplied with a different thickness value to generate an updated MGIP, and the thickness value iteration process can be stopped when the sum of residuals is at or below some predetermined threshold.

Different strategies can be used to minimize processing time to find the interface thickness and level. As noted above, a library based on a table can be provided with different pulse shapes or transfer functions so that residual calculations can be run in parallel.

Disclosed methods may be utilized by a variety of pulsed radar level sensor systems. FIG. 2 depicts an example pulsed radar or ultrasound level finding system shown as a GWR system 200 that includes a pulsed radar gauge shown as a pulsed radar level gauge (PRG) 260 including a disclosed pulsed radar interface determination algorithm 210a shown implemented in the firmware of memory 210 associated with a processor 215, according to an example embodiment. Memory 210 may be on chip or off chip relative to the processor 215. Also shown is a transceiver 220 and coaxial connector 225 that is on the top of the tank 205. The transmitter and the receiver provided by transceiver 220 may be implemented as separate blocks. Accordingly, a transceiver as used herein includes both of these arrangements.

In the transmit direction the processor 215 provides digital signal levels to a digital to analog converter (DAC) 222 which is connected to an input of a pulse generator (PGen) block 221 that is coupled to the transmitter of the transceiver 220. In the receive direction, the receiver of the transceiver 220 receives reflected echo signals that are transduced by the sensor 226, where the output signal from the sensor 226 is coupled to an analog-to-digital converter (ADC) 227 which converts analog signals from the sensor 226 into digital signals for the processor 215 to process which functions as a signal analyzer. Many pulses are generated and the ADC 227 generates the waveform comprising many discrete voltage values that are synchronized by a clock circuit.

A flange (not shown) may also be present on the tank. The waveguide (or probe) is shown as 240. As noted above, although generally described for GWR applications, disclosed level finding can also be applied to ultrasound and non-contacting radar.

Figure 3A:
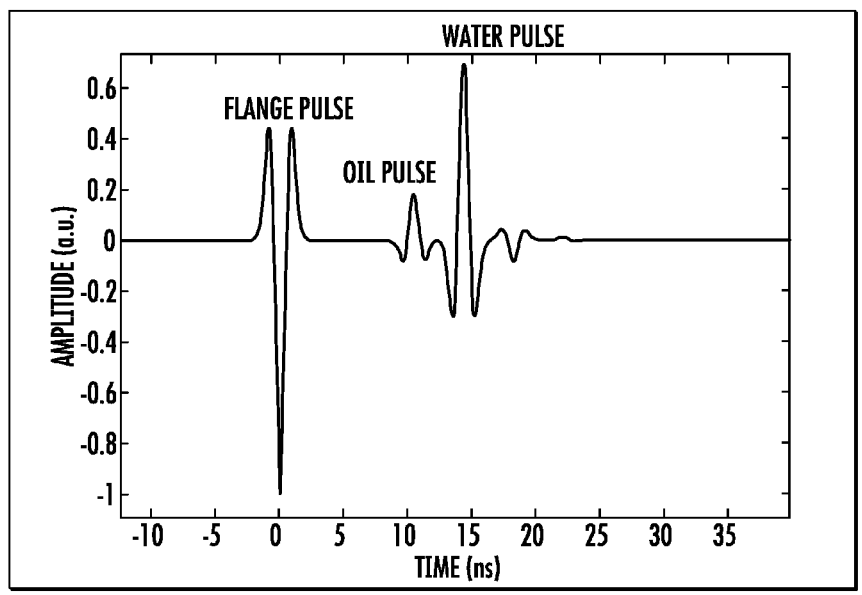
FIGS. 3A-3D shows measured echo curves for a 20 cm oil on water interface, a 10 cm oil on water interface, a 4 cm oil on water interface, and a 2 cm oil on water interface.
Figure 3B:
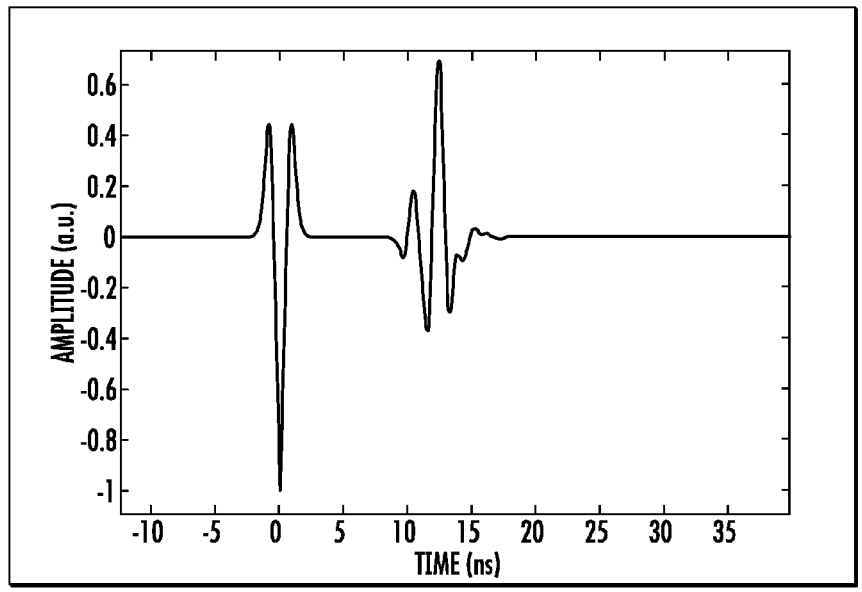
Figure 3C:
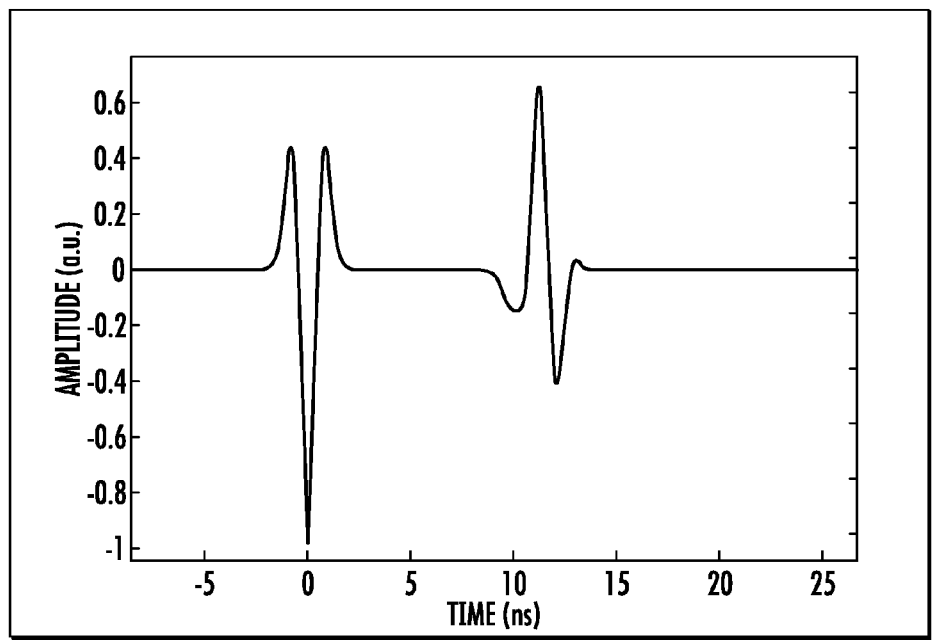
Figure 3D:
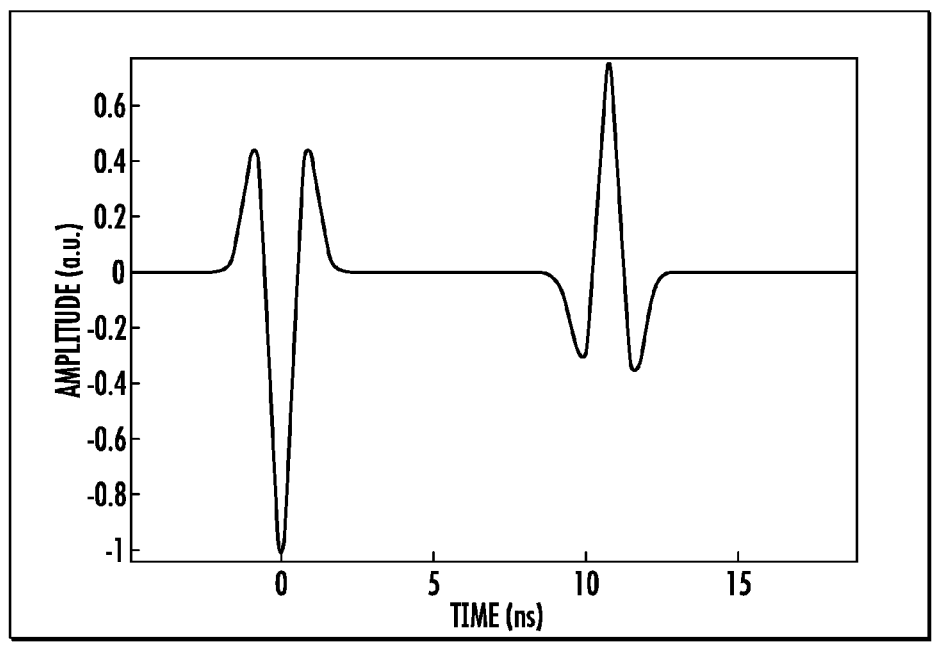

FIGS. 3A-3D shows measured echo curves for a 20 cm oil on water interface, a 10 cm oil on water interface, a 4 cm oil on water interface, and a 2 cm oil on water interface, using a known level finding algorithm. The leftmost pulse in each of these FIGS. is the flange pulse. In FIG. 3A ( 20 cm oil) and FIG. 3B ( 10 cm oil) both an oil pulse and a water pulse are shown. However, in FIG. 3C ( 4 cm oil) and FIG. 3D ( 2 cm of oil) there is only one pulse shown (no evidence of separate oil and water pulses/peaks). Disclosed embodiments recognize despite only a single peak located near the assumed interface in FIGS. 3C and 3D, the pulse shape is a function of the thickness of the oil, so that the thickness of the oil can be determined from the pulse shape, such as using method 100.

EXAMPLES

Disclosed embodiments are further illustrated by the following specific Examples, which should not be construed as limiting the scope or content of this Disclosure in any way.

FIG. 4 shows example field data taken from a GWR system analogous to GWR system 200 shown in FIG. 2 having a PRG 260 installed on a flange on the top of the tank 205, having air over D95 (an oil) on water. There are thus 2 interfaces, 1 interface between the oil and air, and 1 interface between the water and oil. Echo pulses can be seen associated and identified with the flange, the D95, and the water. In the embedded data table, the first entry is the water thickness in centimeters and the second entry is the D95 thickness in centimeters.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

The invention claimed is:

1. A method of pulsed radar interface determination, comprising:

providing refractive indices for a first material and a second material in a tank, said second material being less dense as compared to said first material and forming an interface with said first material, and an interface level determination model (interface model) including a transfer function that utilizes said refractive indices and a thickness of said second material as parameters;

transmitting at least one actual radar pulse into said tank and measuring a resulting echo curve or echo curve portion including at least one measured interface pulse around a location of said interface;

simulating using said interface model run by a processor with a reference pulse as an input along with an initial value for said thickness to generate an initial model generated interface pulse (initial MGIP);

comparing said measured interface pulse to said initial MGIP point-by-point over a plurality of points to determine a plurality of residuals;

wherein if a sum of said residuals (sum of residuals) is >a predetermined threshold, iterating by repeating said comparing with an updated interface model generated from said interface model updated with an updated value for said thickness that provides an updated MGIP; and wherein when said sum of residuals is ≤said predetermined threshold, determining said thickness.

2. The method of claim 1, wherein if said sum of residuals is >said predetermined threshold, repeating said simulating with said updated value for said thickness to generate said updated interface model and said updated MGIP therefrom.

3. The method of claim 1, wherein if said sum of residuals is >said predetermined threshold, obtaining said updated MGIP from a library of said updated MGIPs.

4. The method of claim 1, wherein said reference pulse comprises a through pulse or a flange pulse.

5. The method of claim 1, further comprising updating said reference pulse after a predetermined period of time or after determining a drift in at least one transmitter circuit parameter.

6. The method of claim 1, wherein said interface model comprises an ABCD matrix.

7. The method of claim 1, wherein said interface model comprises approximated Fresnel equations or an electrical impedance model.

8. The method of claim 1, wherein said first material and said second material both comprise liquids.

9. The method of claim 8, wherein measured interface pulse is a single interface pulse where peaks for said first material and said second material overlap.

10. The method of claim 1, wherein said updated value is automatically generated by a perturb-and-measure algorithm.

11. A computer program product, comprising:
a memory including stored program instructions executable by a processor to enable said processor to execute a method of pulsed radar interface determination, said computer program product including:
code for an interface level determination model (interface model) including a transfer function that utilizes refractive indices for a first material and a second material in a tank and a thickness of said second material as parameters, said second material being less dense as compared to said first material and forming an interface with said first material, said interface model run by a processor with a reference pulse as an input along with an initial value for said thickness to generate an initial model generated interface pulse (initial MGIP);
code for comparing a measured interface pulse obtained from transmitting at least one actual radar pulse into said tank and a measured resulting echo curve or echo curve portion including at least one measured interface pulse around a location of said interface to said initial MGIP point-by-point over a plurality of points to determine a plurality of residuals;
code for determining if a sum of said residuals (sum of residuals) is >a predetermined threshold, iterating by repeating said comparing with an updated interface model generated from said interface model updated with an updated value for said thickness that provides an updated model generated interface pulse, and
code for determining when said sum of residuals is ≤said predetermined threshold, and when so, determining said thickness.

12. The computer program product of claim 11, wherein said interface model comprises an ABCD matrix.

13. The computer program product of claim 11, wherein said reference pulse comprises a through pulse or a flange pulse.

14. The computer program product of claim 11, wherein said first material and said second material both comprise liquids.

15. The computer program product of claim 11, wherein said updated value is automatically generated by a perturb-and-measure algorithm.

16. A pulsed radar level gauge, comprising:
a processor having an associated memory storing a pulsed radar interface determination algorithm that includes an interface level determination model (interface model) having a transfer function which utilizes refractive indices for a first and second material in a tank and a thickness of said second material as parameters, said second material being less dense as compared to said first material and forming an interface with said first material;
a pulse width generator (PGen) block that coupled to receive control signals originating from said processor;
a transceiver for coupling to a probe in said tank including an input coupled to an output of said PGen block for transmitting radar pulses and an output coupled through a sensor to an input of said processor for processing echo signals received responsive to said radar pulses;
said pulsed radar interface determination algorithm when implemented by said processor causing:
simulating using said interface model run said processor with a reference pulse as an input along with an initial value for said thickness to generate an initial model generated interface pulse (initial MGIP);
comparing a measured interface pulse obtained responsive to said transceiver transmitting at least one actual radar pulse into said tank and measuring a resulting echo curve or echo curve portion including at said interface pulse around a location of said interface to said initial MGIP point-by-point over a plurality of points to determine a plurality of residuals;
wherein if a sum of said residuals (sum of residuals) is >a predetermined threshold, iterating by repeating said comparing with an updated interface model generated from said interface model updated with an updated value for said thickness that provides an updated MGIP, and
wherein when said sum of residuals is ≤said predetermined threshold, determining said thickness.

17. The pulsed radar level gauge of claim 16, wherein said pulsed radar level gauge implements guided wave radar (GWR).

18. The pulsed radar level gauge of claim 16, wherein if said sum of residuals is >said predetermined threshold, repeating said simulating with said updated value for said thickness to generate said updated interface model and said updated MGIP therefrom.

19. The pulsed radar level gauge of claim 16, wherein if said sum of residuals is >said predetermined threshold, obtaining said updated MGIP from a library of said updated MGIPs.

20. The pulsed radar level gauge of claim 16, wherein said interface model comprises an ABCD matrix.

* * * * *